United States Patent
Allen et al.

(10) Patent No.: US 6,232,799 B1
(45) Date of Patent: May 15, 2001

(54) METHOD AND APPARATUS FOR SELECTIVELY CONTROLLING WEAK FEEDBACK IN REGENERATIVE PASS GATE LOGIC CIRCUITS

(75) Inventors: David Howard Allen; Daniel Lawrence Stasiak, both of Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/411,569

(22) Filed: Oct. 4, 1999

(51) Int. Cl.[7] ............................................... H03K 19/00
(52) U.S. Cl. .............................. 326/113; 326/16; 326/121
(58) Field of Search ............................... 326/95, 98, 112, 326/119, 121, 113

(56) References Cited

U.S. PATENT DOCUMENTS

| | | | |
|---|---|---|---|
| 5,173,626 | * 12/1992 | Kudou et al. | 326/16 |
| 5,272,397 | * 12/1993 | Chen et al. | 326/121 |
| 5,418,473 | * 5/1995 | Canaris | 326/121 |
| 6,046,606 | * 4/2000 | Chu et al. | 326/121 |
| 6,046,608 | * 4/2000 | Theogarajan | 326/121 |

* cited by examiner

Primary Examiner—Michael Tokar
Assistant Examiner—Don Phu Le
(74) Attorney, Agent, or Firm—Joan Pennington

(57) ABSTRACT

A method and apparatus are provided for selectively controlling weak feedback in pass gate logic circuits. The pass gate logic circuit includes an intermediate node. A feedback transistor stack is connected between the intermediate node and a voltage supply. The feedback transistor stack includes a pair of transistors. A test signal is applied to a control input of one of the pair of transistors for selectively activating the feedback transistor stack.

12 Claims, 9 Drawing Sheets

METHOD AND APPARATUS FOR SELECTIVELY CONTROLLING WEAK FEEDBACK IN REGENERATIVE PASS GATE LOGIC CIRCUITS

FIELD OF THE INVENTION

The present invention relates to a method and apparatus for selectively controlling weak feedback in regenerative pass gate logic circuits.

DESCRIPTION OF THE RELATED ART

Pass gate static logic differs from traditional static logic by applying logical signals to transistor source, drain and gate terminals where static logic applies logic signals to only gate terminals. Pass gate logic as a family of circuit design styles offers significant advantages over static logic, particularly in performance and reduced area required. Therefore, it is desirable to use pass gate logic to implement as much of the logical function of a VLSI chip design as possible. A custom processor may incorporate a hundred thousand or more pass gate logic gates in its design.

One style of pass gate logic is the regenerative pass gate logic, (RPGL). FIG. 1 shows a typical RPGL gate. True and complementary signals A and A_L drive the source of the pass gate transistors and B and B_L control the gates of the pass gate transistors to determine the state of nodes XNOR and XOR.

A problem with non-regenerative pass gate logic circuits is that the NFET pass gates will only drive node X (or X_L) to within a NFET threshold voltage of the supply (Vdd-Vt). Since node X is not driven completely to Vdd in non-RGPL circuits the PFET of the output inverter remains weakly on, allowing power dissipation.

Another common problem for pass gate logic is noise on the signals controlling gates (B and B_L in the example). Noise on these signals can allow the NFET pass gates to conduct partially. In FIG. 1, if A and B are at gnd and A_L and B_L are at Vdd, only one NFET, N1, is driving node X_L high. If noise on B and became high enough, N3 would conduct a low signal and cause a noise glitch on node X_L. Additional power would also be dissipated since current flows from A_L through N1 and N3 to ground while noise is present on the gate of N3.

In SOI technology, pass gate logic is susceptible to higher bipolar current problem than in bulk technologies. FIG. 4 shows a typical RGPL circuit which can be susceptible to bipolar current in SOI. If D0, D1, D2, and D3 are all low (D0_L, D1_L, and D3_L are all high), and S0 is high and S1, S2, S3 are all low, node X will be low and node X_L will be high. The bodies of transistors N4, N5, N6, and N7 will all leak to a high level. If the selects (S0-S3) remain as they were but D1, D2, and D3 go high, D1_L, D2_L, and D3_L will go low. This will cause N5, N6, and N7 to conduct parasitic bipolar current from node X_L to the inputs D1_L, D2_L, and D3_L. If the magnitude of this current is high enough, X_L will drop and a glitch will appear on the output OUT_L. Eventually N4 will win and drive node X_L high but the noise form this bipolar affect will require a longer time to evaluate the proper values. This longer time may not be available for critical paths so incorrect logic operation is possible. This noise effect is greater as the number of pass gates are added to drive nodes X and X_L. The number of pass gates can be reduced but the cost would be more logic levels to provide the same function so timing would still be compromised.

RGPL attempts to solve the noise and power problems with the addition of two PFET feedback devices P0 and P1. Since X and X_L will always be the complements of each other, each can be used to gate the feedback PFET of the other. This allows nodes X (or X_L) to increase from Vdd-Vt to Vdd when X_L (or X) goes low. However, the addition of the PFET feedback devices can result in a delay penalty since the first node to switch (X or X_L) must wait for the input drivers driving through the pass gates to defeat the PFET feedback device. If the PFET feedback device is too large this delay can be significant, and may even prevent the circuit from switching at all. If the PFET feedback device is sized too small it will not adequately address the noise and power issues described above.

Another style of pass gate logic is the N-channel pass gate logic, (NPGL). FIG. 6 shows a typical NPGL gate. Data inputs, IN(O:n), are buffered with an inverter and Control inputs, Select (O:n), drive the NFET gates to determine the state of node X. A problem with the NPGL family is the NFETs pass gates will only drive node X to Vdd-Vt. Since node X is not driven completely to Vdd, the PFET of the output inverter remains weakly on allowing power dissipation. To solve this power problem a feedback device, P0, is added to bring node X from Vdd-Vt to Vdd when the circuit output OUT, falls from Vdd.

Another common problem for pass gate logic is noise on the Select(0:n) signals. Any noise will allow the pass gates to conduct partially. In FIG. 6, if IN(0:n-1) and Select(1:n) are at ground and Select(0) and IN(n) are at Vdd, only on NFET, NO, is driving node X high. If Select(n) had noise and became higher than ground, Nn would conduct a low signal to and cause a noise glitch on node X. Power would also be used while IN(0) is driving high and IN(n) is partially driving low. Pass gate logic is also victim to input noise from IN(0:n). The inverters help prevent noise problems but could still be seen by the node X if the relevant pass gate is on.

In SOI technology, pass gate logic is susceptible to higher bipolar current problem than in bulk technologies. FIG. 6 shows a typical pass gate logic circuit. If IN(0:n) and Select(1:n) are at ground and Select (0) is at Vdd, only one NFET, N0, is driving node X high. If during this time in SOI technology the data inputs IN(1:n) switch from low to high, bipolar current will be introduced in NFETs N2 through Nn pulling charge from node X. This bipolar current will drop node X's voltage while P0 and N0 devices continue to drive node X high. Eventually N0 and P0 will win and drive node X high but the noise from this bipolar affect will require a longer time to evaluate the proper values. This longer time may not be available for critical paths so incorrect logic operation is possible. This noise effect is greater as the number of pass gates are added to drive node X. The number of pass gates can be reduced but the cost would be more logic levels to provide the same function so timing would still be compromised.

Similar problems occur on Complementary Pass Gate Logic (CPL), illustrated in FIG. 7.

The designer of a pass gate circuit must trade-off the performance impact of fewer or smaller pass gate devices connected to a nodes X and X_L versus the risk of not operating properly due to bipolar currents. Moreover, different environmental conditions dictate that a designer design for the worst-case situation. For example, for reliability reasons circuits are subject to higher voltages and temperatures than in which they are normally required to operate, such as, during burn-in, dynamic voltage stress, and the like, in order to stress the design and accelerate early failures. Typically reliability stressing is performed at a higher temperature and voltage but the performance requirements are much less. The circuits are required to be functional but need only perform at a fraction of the normal speed.

Since higher temperatures and voltages can aggravate leakage and noise mechanisms, the designer must design-in a greater amount of feedback than is required for normal operation to ensure that the circuits remain functional under the most severe conditions. This affects performance, not only under stress conditions where high performance is not required, but also under normal operation when performance is paramount.

Therefore, it is desired to have some method for providing more feedback when more is needed and performance is not a concern, for example, under reliability stress conditions, and providing less feedback when less is needed to maintain function and less is desirable for performance reasons.

SUMMARY OF THE INVENTION

A principal object of the present invention is to provide a method and apparatus for selectively controlling weak feedback in pass gate logic circuits. Other objects are to provide such method and apparatus for selectively controlling weak feedback in pass gate logic circuits substantially without negative effects and that overcomes many of the disadvantages of prior art arrangements.

In brief, a method and apparatus are provided for selectively controlling weak feedback in pass gate logic circuits. The pass gate logic circuit includes an intermediate node. A feedback transistor stack is connected between the intermediate node and a voltage supply. The feedback transistor stack includes a pair of transistors. A test signal is applied to a control input of one of the pair of transistor for selectively activating the feedback transistor stack.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the preferred embodiments, a method is provided for selectively controlling the amount of feedback that is supplied to the static node in a pass gate logic circuit.

Figure 1:
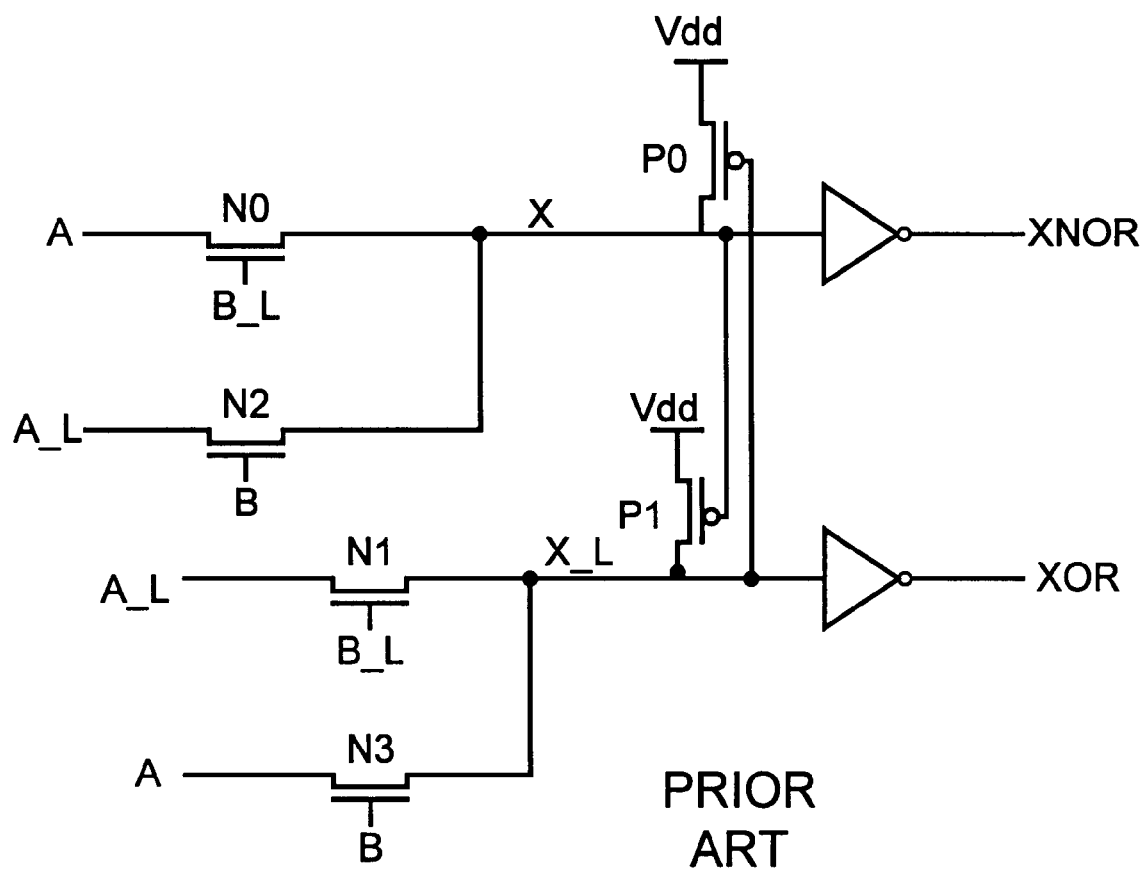
FIG. 1 is a schematic diagram of a prior art regenerative pass gate logic (RPGL) gate.
Figure 2:
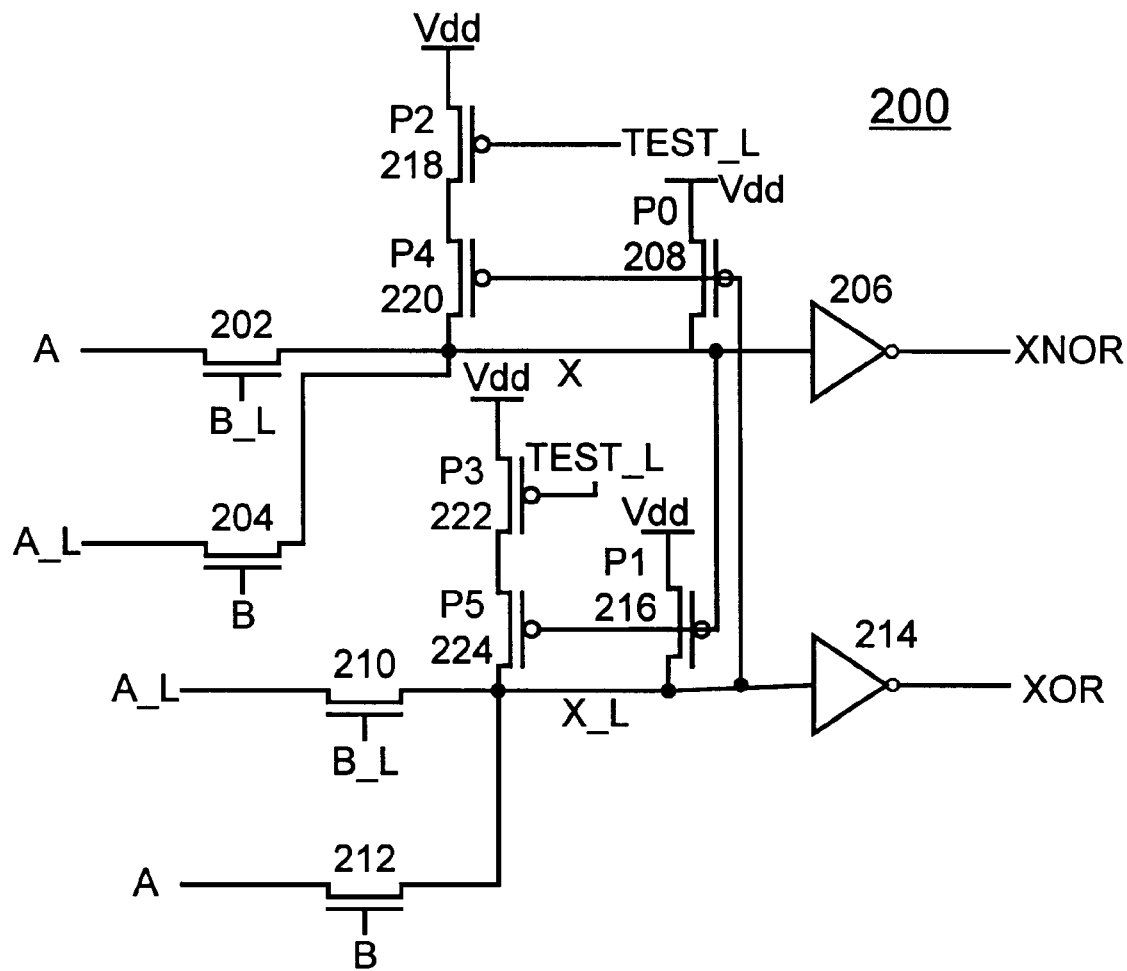
FIG. 2 is a schematic diagram of a regenerative pass gate logic (RPGL) gate of the preferred embodiment.

Referring now to FIG. 2, there is shown a regenerative pass gate logic (RPGL) gate generally designated by the reference character 200 of the preferred embodiment. RPGL XNOR/XOR gate 200 includes a pair of N-channel field effect transistors (NFETS) 202, 204 having true and complementary signals A and A_L respectively drive a source of the NFETs. Complementary and true signals B_L and B respectively control a gate of the NFETs 202, 204. A drain of the NFETs 202, 204 is connected to an intermediate node X. An inverter 206 connected to intermediate node X provides an output at a node XNOR. A P-channel field effect transistor (PFET) P0, 208 is connected between a supply voltage Vdd and the intermediate node X. A complement side of RPGL XNOR/XOR gate 200 similarly includes a pair of N-channel field effect transistors (NFETs) 210, 212 having complementary and true signals A_L and A respectively drive a source of the NFETs 210, 212. Complementary and true signals B_L and B respectively control a gate of the NFETs 210, 212. A drain of the NFETs 210, 212 is connected to a complement intermediate node X_L. An inverter 214 connected to complement intermediate node X_L provides an output at a node XOR. A P-channel field effect transistor P1, 216 is connected between a supply voltage Vdd and the complement intermediate node X_L. A gate of the PFET P0, 208 is connected to the complement intermediate node X_L. A gate of the PFET P1, 216 is connected to the intermediate node X.

Selectively controlling the amount of feedback that is supplied to the static node in the pass gate logic circuit 200 in accordance with the invention is achieved with four PFETs P2, P4, P3, P5, 218, 220, 222, 224. Two PFETs P2, P4, 218, 220 are stacked on the true side between node X and the voltage supply, and two other PFETs P3, P5, 222, 224 are stacked on the complementary side between node X_L and the voltage supply. PFET P2, 218 has its source connected to supply Vdd, its drain connected to the source of PFET, P4, 220, and its gate connected to a test signal TEST_L. PFET, P4, 220 has its gate connected to complement intermediate signal X_L and its drain connected to the intermediate node X. PFETs P3, P5, 222, 224 are similarly arranged for the X_L node. PFET P3, 222 has its source connected to supply Vdd, its drain connected to the source of PFET, P5, 224, and its gate connected to a test signal TEST_L. PFET, P5, 224 has its gate connected to intermediate signal X and its drain connected to the intermediate node X_L.

Test signal TEST_L is used to control when the feedback devices PFET P2, 218 and PFET P3, 222 are turned on. If TEST_L is low (GND), then the gate-to-source voltage (VGS) of both PFET P2, 218 and PFET P3, 222 is VDD and PFETs P2 and P3, 218, 222 is full on. This provides the maximum amount of feedback current and is the useful configuration for the circuit operating under conditions of maximum leakage and noise and where performance is not a concern, for example, reliability stress conditions. If TEST_L is at VDD or high, both PFET P2, 218 and PFET P3, 222 are off and no current is supplied to nodes X and X_L. Typically, however, the normal operating configuration would be for TEST_L to be at VDD, to turn off both PFET P2, 218 and PFET P3, 222 so no extra current conducts to nodes X and X_L. This provides the minimal amount of current which is required for safe operation, compensating for leakage, and the like, but does not significantly impair performance since the amount of current that must be overcome by the pass gate logic network is negligible.

Figure 3:
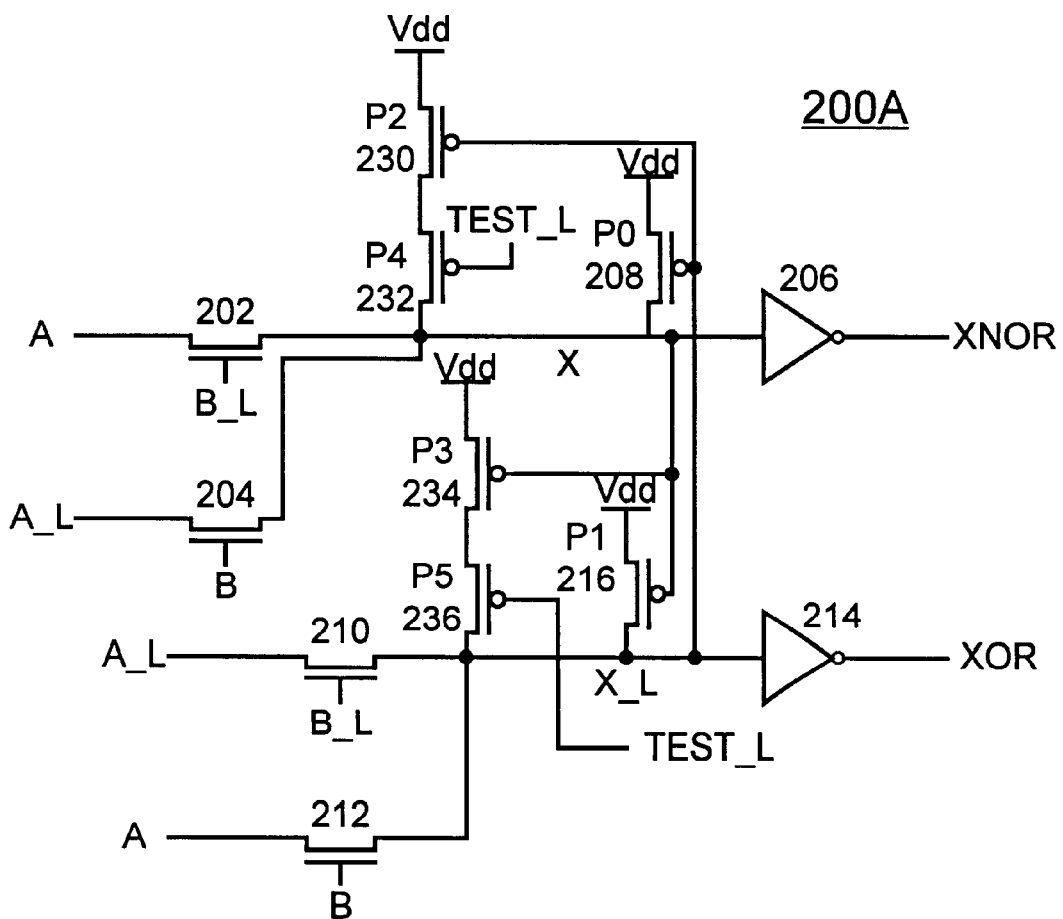
FIG. 3 is a schematic diagram of an alternative regenerative pass gate logic (RPGL) gate of the preferred embodiment.
Figure 4:
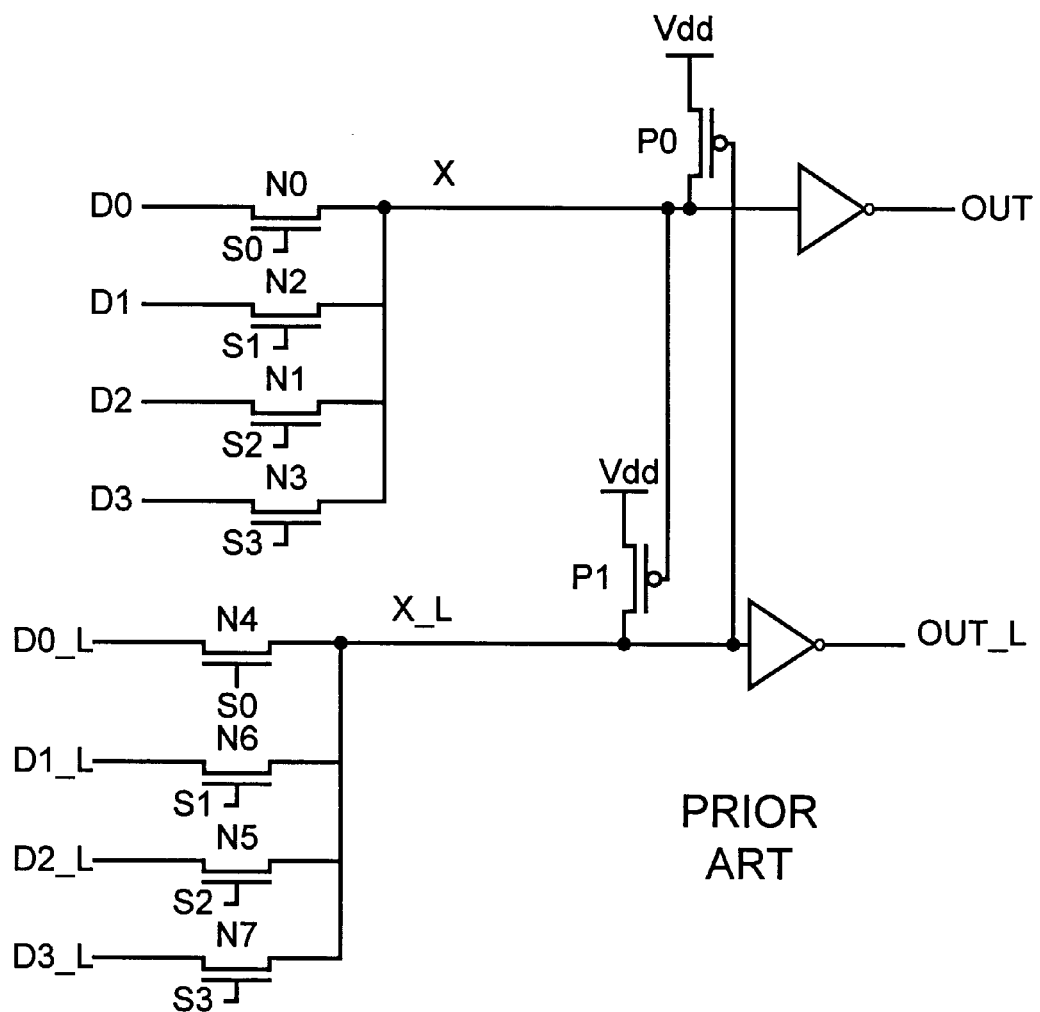
FIG. 4 is a Schematic diagram of a prior art regenerative pass gate logic (RPGL) multiplexer circuit susceptible to bipolar current in silicon-on-insulator (SOI) technology.

FIG. 3 illustrates an alternative regenerative pass gate logic (RPGL) gate generally designated by the reference character 200A of the preferred embodiment. Identical components of RPGL gate 200A as RPGL gate 200 of FIG. 2 are given identical reference character numbers. Selectively controlling the amount of feedback that is supplied to the static node in the pass gate logic circuit 200 in accordance with the invention is achieved with four PFETs P2, P4, P3, P5, 230, 232, 234, 236. Two PFETs P2, P4, 230, 232 are stacked on the true side between node X and the voltage supply, and two other PFETs P3, P5, 234, 236 are stacked on the complementary side between node X_L and the voltage supply. PFET P2, 230 has its source connected to supply Vdd, its drain connected to the source of PFET, P4, 232, and its gate connected to a complement intermediate signal X_L. PFET, P4, 232 has its gate connected to test signal TEST_L and its drain connected to the intermediate node X. PFETs P3, P5, 234, 236 are similarly arranged for the X_L node. PFET P3, 234 has its source connected to supply Vdd, its drain connected to the source of PFET, P5, 236, and its gate connected to intermediate signal X. PFET, P5, 224 has its gate connected to test signal TEST_L and its drain connected to the intermediate node X_L. Compared to the XOR/XNOR RPGL gate circuit 200 of FIG. 2, the roles of PFETs P2 and P4, 230 and 232 are swapped and PFETs P3 and P5, 234 and 236 are swapped, but otherwise the operation is the same. This configuration of RPGL gate circuit 200A may provide better performance when TEST_L is high during normal operation since the capacitance of the intermediate nodes between PFETs P2 and P4, 230 and 232 and between PFETs P3 and P5, 234 and 236 is shielded or no longer channel-connected by the non-conductive or off transistors PFETs P4 and P5, 232 and 236.

Figure 5:
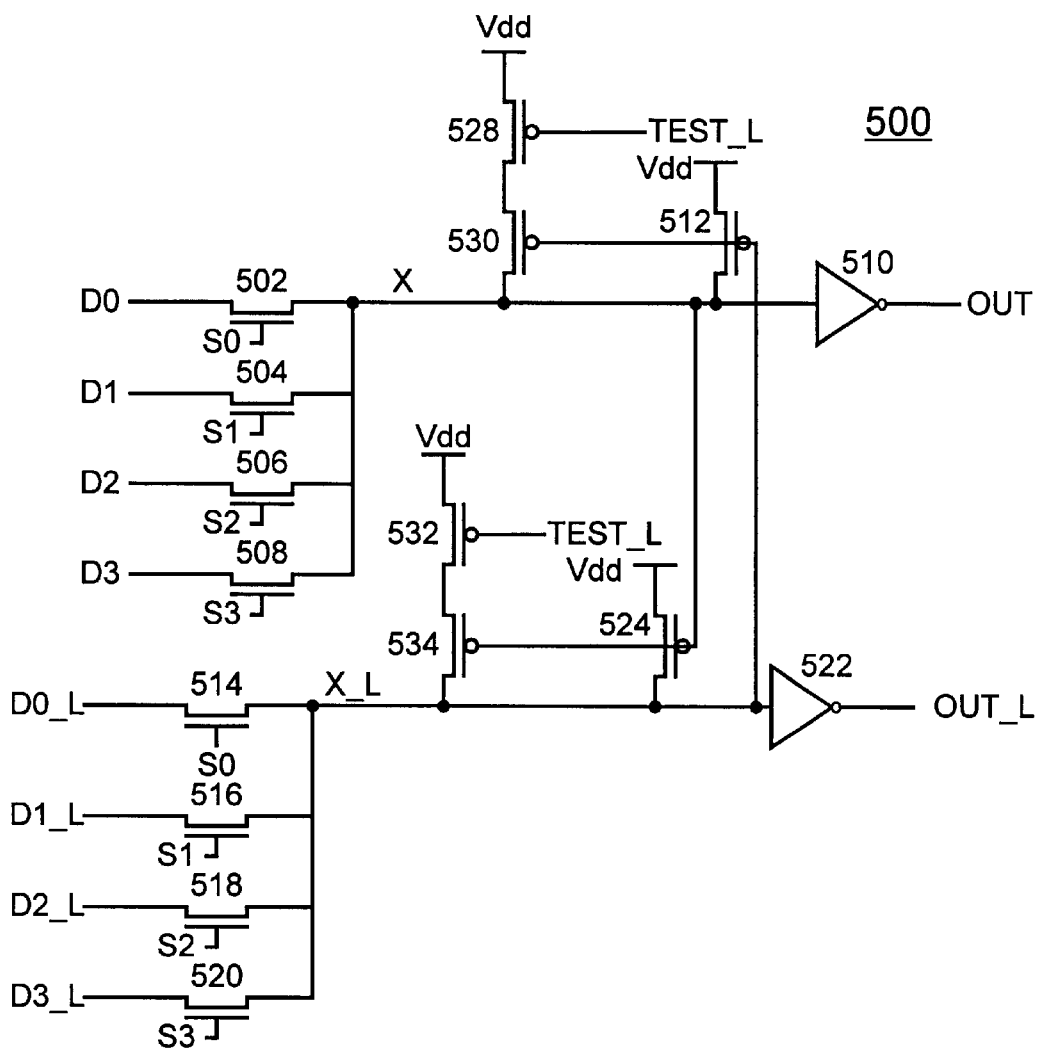
FIG. 5 is a schematic diagram of a regenerative pass gate logic (RPGL) multiplexer circuit of the preferred embodiment.
Figure 6:
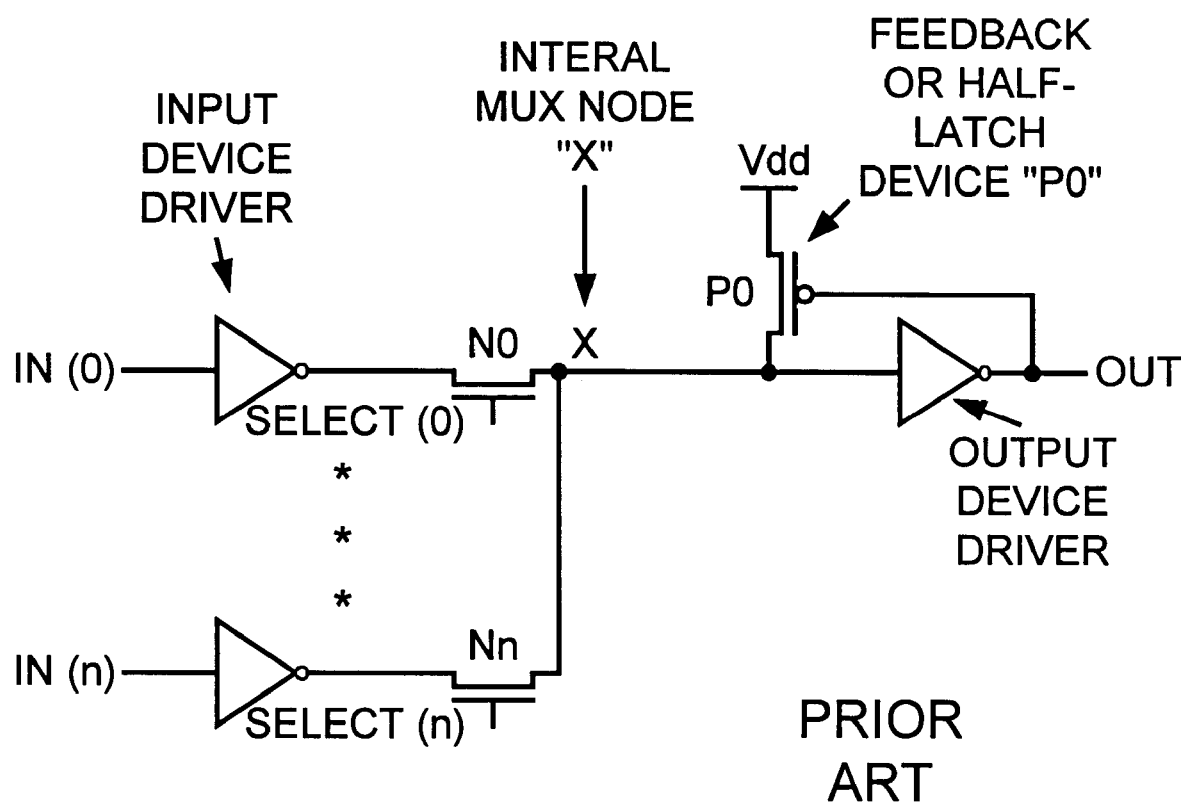
FIG. 6 is a schematic diagram of a prior art N-channel pass gate logic (NPGL) gate.
Figure 7:
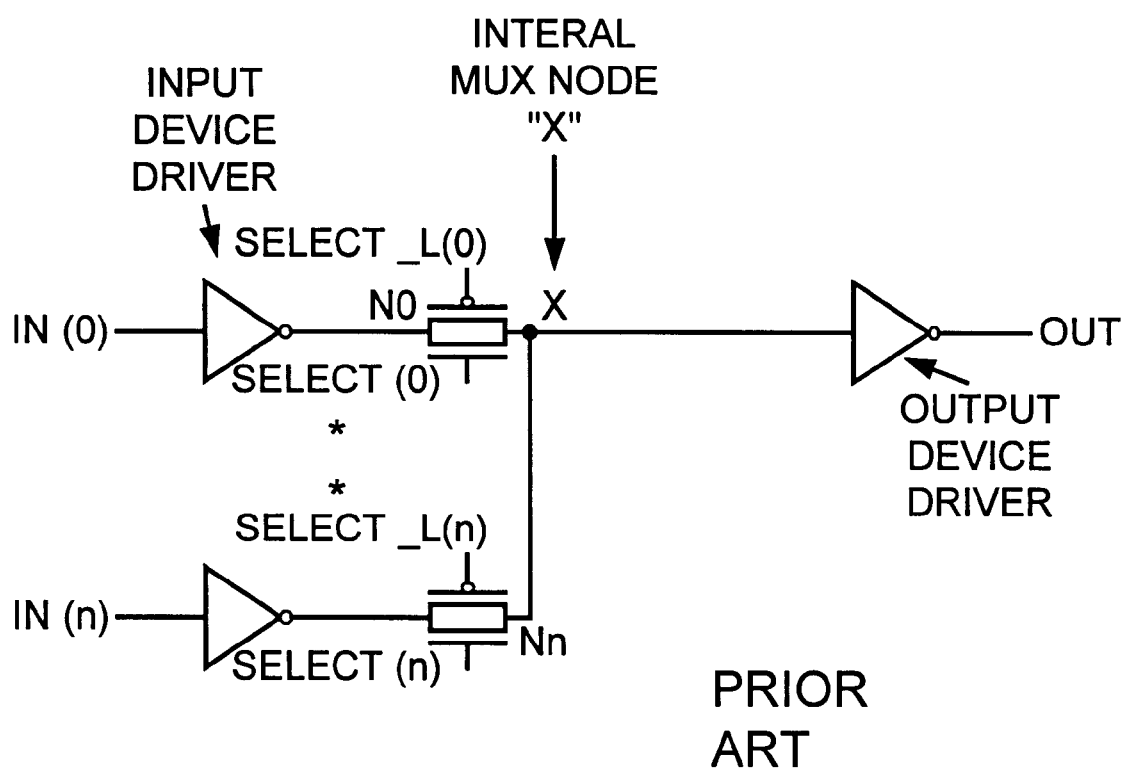
FIG. 7 is a schematic diagram of a prior art complementary T gate logic (TPGL) gate.

Referring now to FIG. 5, there is shown a 4:1 multiplexer circuit generally designated by the reference character 500 of the preferred embodiment. Multiplexer circuit 500 includes four N-channel field effect transistors NFETs 502, 504, 506 and 508 connected between a respective data input D0, D1, D2, D3 and an intermediate node X. An inverter 510 connected to intermediate node X provides an output at a node OUT. A P-channel field effect transistor (PFET) 512 is connected between a supply voltage Vdd and the intermediate node X. A complement side of 4:1 multiplexer circuit 500 includes four N-channel field effect transistors NFETs 514, 516, 518, 520 connected between a respective complement data input D0_L, D1_L, D2_L, D3_L and a complement intermediate node X_L. An inverter 522 connected to complement intermediate node X_L provides a complement output at a node OUT_L. A P-channel field effect transistor (PFET) 524 is connected between a supply voltage Vdd and the complement intermediate node X_L. A gate of the PFET 512 is connected to the complement intermediate node X_L. A gate of the PFET 524 is connected to the intermediate node X.

Selectively controlling the amount of feedback that is supplied to the static node in the 4:1 multiplexer circuit 500 in accordance with the invention is achieved with four PFETs 528, 530, 532, 534. Two PFETs 528, 530 are stacked on the true side between node X and the voltage supply, and two other PFETs 532, 534 are stacked on the complementary side between node X_L and the voltage supply. PFET 528 has its source connected to supply Vdd, its drain connected to the source of PFET 530 and its gate connected to a test signal TEST_L. PFET 530 has its gate connected to complement intermediate signal X_L and its drain connected to the intermediate node X. PFETs 532, 534 are similarly arranged for the X_L node. PFET 532 has its source connected to supply Vdd, its drain connected to the source of PFET 534, and its gate connected to a test signal TEST_L. PFET, 534 has its gate connected to intermediate signal X and its drain connected to the intermediate node X_L.

Test signal TEST_L is used to control when the feedback devices PFET 528 and PFET 532 are turned on. If TEST_L is low (GND), then the gate-to-source voltage (VGS) of both devices PFET 528 and PFET 532 is VDD and PFETs PFET 528 and PFET 532 is full on. This provides the maximum amount of feedback current and is the useful configuration for the circuit operating under conditions of maximum leakage and noise and where performance is not a concern, for example, reliability stress conditions. If TEST_L is at VDD or high, both PFET 528 and PFET 532 are off and no current is supplied to nodes X and X_L.

Figure 8:
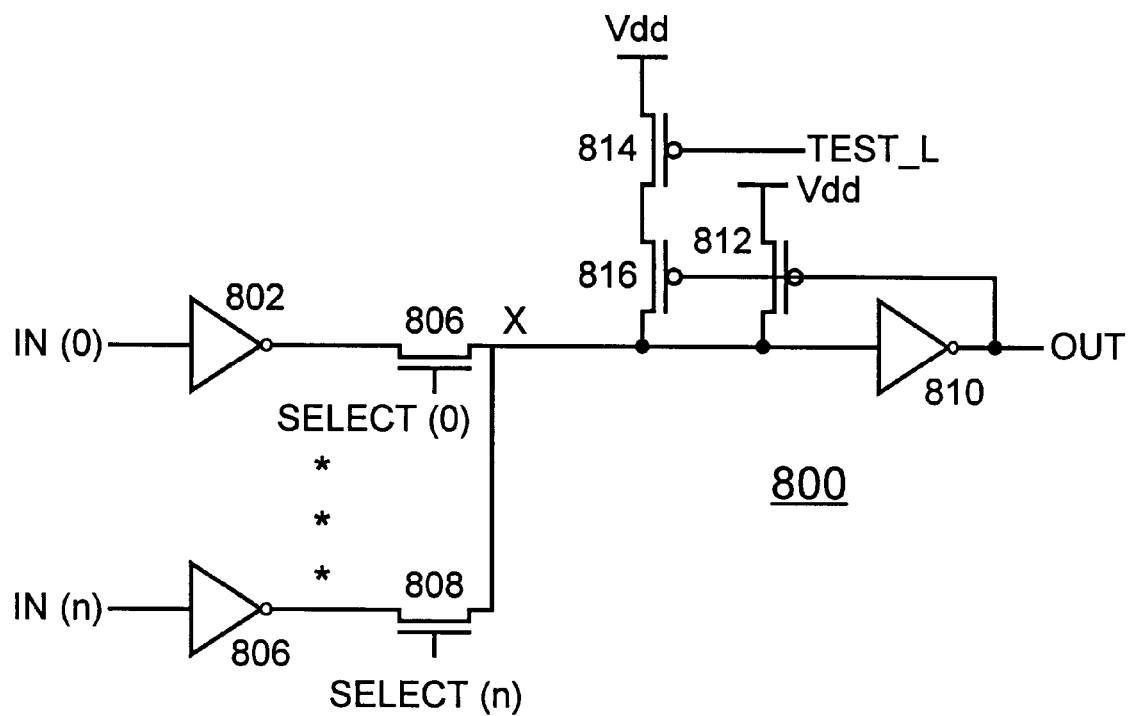
FIG. 8 is a schematic diagram of a N-channel pass gate logic (NPGL) gate of the preferred embodiment.

Referring now to FIG. 8, there is shown an N-channel pass gate logic (NPGL) circuit generally designated by the reference character 800 of the preferred embodiment. NPGL circuit 800 includes multiple data inputs IN (0) through IN (n), each buffered by a respective inverter 802, 804 connected to an N-channel field effect transistor NFET 806, 808. Control inputs SELECT (0) through SELECT (n) applied to the gate of NFETs 806, 808, drive the NFETs 806, 808 to determine the state of an intermediate node X. An inverter 810 connected to intermediate node X provides an output at a node OUT. A P-channel field effect transistor (PFET) 812 is connected between a supply voltage Vdd and the intermediate node X. A gate of the PFET 812 is connected to the output of inverter 810.

Selectively controlling the amount of feedback that is supplied to the static node in the NPGL circuit 800 in accordance with the invention is achieved with a pair of PFETs 814, 816. PFETs 814, 816 are stacked between node X and the voltage supply. PFET 814 has its source connected to supply Vdd, its drain connected to the source of PFET 816 and its gate connected to a test signal TEST_L. PFET 816 has its gate connected to the output of inverter 810 and its drain connected to the intermediate node X. Test signal TEST_L is used to control when the feedback device PFET 814 is turned on. If TEST_L is low (GND), then the gate-to-source voltage (VGS) of feedback device PFET 814 is VDD and feedback device PFET 814 is full on. If TEST_L is at VDD or high, PFET 814 is off and no current is supplied to node X.

Figure 9:
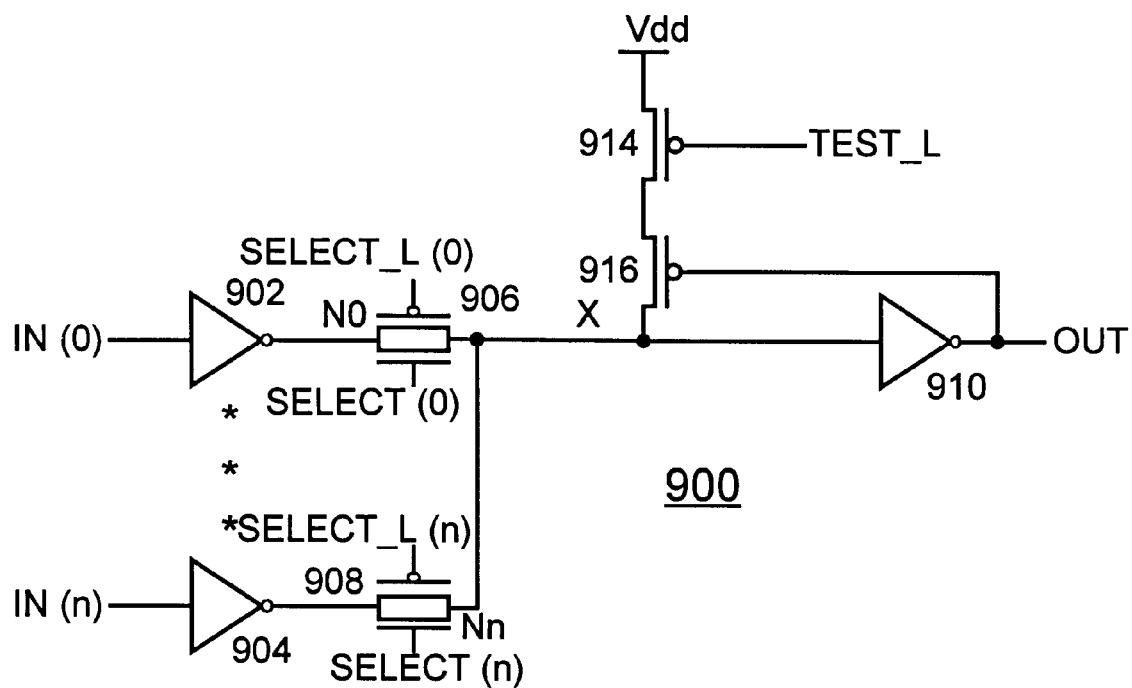
FIG. 9 is a schematic diagram of a complementary T gate logic (TPGL) gate of the preferred embodiment.

Referring now to FIG. 9, there is shown a complementary Pass Gate Logic (CPL) circuit generally designated by the reference character 900 of the preferred embodiment. CPL circuit 900 includes multiple data inputs IN (0) through IN (n), each buffered by a respective inverter 902, 904 connected to a parallel connected P-Channel and N-channel field effect transistors PFET and NFET 906, 908. Control inputs SELECT (0) through SELECT (n) applied to the gates of NFETs 906, 908, complement control inputs SELECT_L (0) through SELECT_L (n) are applied to the gates of the PFETs 906, 908, drive the parallel P/NFETs 906, 908 to determine the state of an intermediate node X. An inverter 910 connected to intermediate node X provides an output at a node OUT.

Selectively controlling the amount of feedback that is supplied to the static node in the CPL circuit 900 in accordance with the invention is achieved with a pair of PFETs 914, 916. PFETs 914, 916 are stacked between node X and the voltage supply. PFET 914 has its source connected to supply Vdd, its drain connected to the source of PFET 916 and its gate connected to a test signal TEST_L. PFET 916 has its gate connected to the output of inverter 910 and its drain connected to the intermediate node X. Test signal TEST_L is used to control when the feedback device PFET 914 is turned on. If TEST_L is low (GND), then the gate-to-source voltage (VGS) of feedback device PFET 914 is VDD and feedback device PFET 914 is full on. If TEST_L is at VDD or high, PFET 914 is off and no current is supplied to node X.

In a chip design, a single scannable test latch could centrally generate the test signal TEST_L to all circuits via internal buffering. Alternately, local copies of scannable test latch could be generated, allowing local control and tailored to meet the specific local needs of the various circuits on the chip. In summary, typically the test latch output would be GND under stressful, non-performance-critical conditions (reliability stress) and VDD for normal operation.

While the present invention has been described with reference to the details of the embodiments of the invention shown in the drawing, these details are not intended to limit the scope of the invention as claimed in the appended claims.

What is claimed is:

1. Apparatus for selectively controlling weak feedback in a pass gate logic circuit comprising:
   an intermediate node;
   a feedback transistor stack connected between said intermediate node and a voltage supply; said feedback transistor stack including a pair of transistors; and
   a test signal applied to a control input of one of said pair of transistors for selectively activating said feedback transistor stack.

2. Apparatus for selectively controlling weak feedback in a pass gate logic circuit as recited in claim 1 wherein said feedback transistor stack includes a pair of P-channel field effect transistors.

3. Apparatus for selectively controlling weak feedback in a pass gate logic circuit as recited in claim 2 wherein said test signal is applied to a gate of one of said pair of transistors.

4. Apparatus for selectively controlling weak feedback in a pass gate logic circuit as recited in claim 3 wherein a low test signal is applied to a gate of one of said pair of transistors for selectively activating said feedback transistor stack.

5. Apparatus for selectively controlling weak feedback in a pass gate logic circuit as recited in claim 2 includes an output stage connected to said intermediate node and wherein a gate of the other one of said pair of transistors is connected to an output of said output stage.

6. Apparatus for selectively controlling weak feedback in a pass gate logic circuit as recited in claim 1 includes a complementary intermediate node and a second feedback transistor stack connected between said complementary intermediate node and a voltage supply.

7. Apparatus for selectively controlling weak feedback in a pass gate logic circuit as recited in claim 6 wherein each said feedback transistor stack includes a pair of P-channel field effect transistors.

8. Apparatus for selectively controlling weak feedback in a pass gate logic circuit as recited in claim 7 wherein a low test signal is applied to a gate of one of said pair of transistors of each said feedback transistor stack for selectively activating both said feedback transistor stacks.

9. Apparatus for selectively controlling weak feedback in a pass gate logic circuit as recited in claim 7 wherein a gate of the other one of said pair of transistors of said second feedback transistor stack is connected to said intermediate node.

10. Apparatus for selectively controlling weak feedback in a pass gate logic circuit as recited in claim 7 wherein a gate of the other one of said pair of transistors of said feedback transistor stack is connected to said complementary intermediate node.

11. A method for selectively controlling weak feedback in a pass gate logic circuit including an intermediate node, said method comprising the steps of:
    providing a feedback transistor stack connected between the intermediate node and a voltage supply; said feedback transistor stack including a pair of transistors; and
    applying a test signal to a control input of one of said pair of transistors for selectively activating said feedback transistor stack.

12. A method for selectively controlling weak feedback in a pass gate logic circuit as recited in claim 11 wherein said feedback transistor stack includes a pair of P-channel field effect transistors (PFETs) and wherein a low test signal is applied to a gate of one of said PFETs for selectively activating said feedback transistor stack.

* * * * *